United States Patent [19]

Zuppinger et al.

[11] 4,321,351

[45] Mar. 23, 1982

[54] PROCESS FOR THE PRODUCTION OF EPOXY RESIN CASTINGS

[75] Inventors: Paul Zuppinger, Arlesheim; Dieter Baumann, Rheinfelden, both of Switzerland

[73] Assignee: Ciba-Geigy Corporation, Ardsley, N.Y.

[21] Appl. No.: 200,705

[22] Filed: Oct. 27, 1980

[30] Foreign Application Priority Data

Nov. 5, 1979 [CH] Switzerland .................. 9907/79

[51] Int. Cl.$^3$ ............................................ G08G 59/42
[52] U.S. Cl. ...................................... 528/91; 528/92;
528/110; 528/112; 528/115; 528/361; 528/365;
528/281; 528/297; 264/281; 264/297
[58] Field of Search ............... 528/91, 92, 110, 112,
528/115, 361, 365, 281, 297

[56] References Cited

U.S. PATENT DOCUMENTS

| | | |
|---|---|---|
| 3,004,931 | 10/1961 | Brueschweiler et al. ......... 528/91 |
| 3,072,606 | 1/1963 | Zuppinger et al. ............... 528/91 |
| 3,142,657 | 7/1964 | Fisch .............................. 528/110 X |
| 3,242,104 | 3/1966 | Brueschweiler et al. ......... 528/91 |
| 3,523,143 | 8/1970 | Kwong ........................... 528/110 X |
| 3,624,180 | 11/1971 | Schmid et al. ................... 525/438 |
| 3,941,725 | 3/1976 | Schmitter et al. ............... 521/135 |
| 3,954,712 | 5/1976 | Lottanti et al. ................. 528/115 |

*Primary Examiner*—Earl A. Nielsen
*Attorney, Agent, or Firm*—Luther A. R. Hall

[57] ABSTRACT

The invention relates to a process in which, as essential components, liquid epoxy resins, carboxylic anhydrides, zinc fluoroborate complex compounds, water, tetrahydropyrane and compounds (X) which contain OH groups, COOH groups or both groups together, are reacted. Selective choice of the special quantity ratios results in reaction mixtures which, at low temperature (e.g. at 100° C.), require only short moulding times and have a sufficiently long pot life. As the reaction is only slightly exothermic, the process can be used very advantageously for encapsulating electronic components.

13 Claims, No Drawings

PROCESS FOR THE PRODUCTION OF EPOXY RESIN CASTINGS

Up to the present, the polyurethane method has been mainly employed for the production of synthetic resin castings which are of great importance e.g. for encapsulating heat-sensitive electronic components in mass production. The reason for this is that, in polyurethane systems, only brief moulding times of e.g. less than 5 minutes are necessary, and that the pot life at room temperature is sufficiently long. This latter feature means that, when not using complicated mechanical feed hoppers, relatively large batches can be used for the production of smaller articles as well. The pot life is at least 30 minutes to several hours. The use of such a polyurethane method, however, also has drawbacks. It is known that this method has an exceedingly high water susceptibility, which makes additional water removal steps and numerous operations necessary. In comparison to epoxy resin systems, the polyurethane castings ultimately obtained are unsatisfactory in respect of ageing, water absorption and electrical properties.

Epoxy resin casting systems are known which require very short moulding times (e.g. 5 minutes at 100° C.), and which have a pot life (for about 100 g) of more than 30 minutes at room temperature. In this respect, attention is drawn to the amine-curable bisphenol A epoxy resins. However, such epoxy resin casting systems have the disadvantageous characteristic of being highly exothermic. They are therefore very often totally unsuitable for encapsulating electronic components. It is known that electronic components frequently contain soldered points, metal coatings and implantations and the like, which cannot be exposed to elevated temperatures without suffering damage. The exothermic behaviour also often results in the formation of bubbles, which is undesirable.

In U.S. Pat. No. 3,941,725 there are disclosed already foamable epoxy resin mixtures which, in addition to containing the polyepoxide compound and the blowing agent, can also contain boron trifluoride as well as a number of different complexes with boron trifluoride, carboxylic anhydrides, water, polyols, and cyclic ethers. Such systems are strongly catalysed, so that foaming occurs very rapidly after the mixture has been obtained, and the pot life is very short. If such mixtures do not contain any blowing agent, then the reaction rate hardly slows down at all. The omission of propellant energy rather tends to result in further acceleration and exothermic reaction. Owing to the too short pot life alone, such systems are not suitable for the simple normal production of castings. At best, the casting method is applicable if complicated and costly mechanical feed hoppers are employed.

It is the object of the present invention to provide a process for the production of epoxy resins which can be used, in particular, for making castings, and which does not have the drawbacks of the epoxy resin systems cited as prior art. The moulding time shall, accordingly, not exceed 5 minutes at 100° C., and the pot life at room temperature (100 g) shall preferably be at least 30 minutes, such that there is no necessity to use a complicated mechanical feed hopper. At the same time, a strongly exothermic reaction shall not occur as in the known process, which is based on the amine-curing of bisphenol A epoxy resins. In contrast to the known process, the process of this invention shall be intended specifically for encapsulating by casting heat-sensitive electrical components. The final products obtained by means of such a process shall furthermore have at least as good mechanical, chemical and electrical properties as the products which can be obtained by casting other known, rapidly hardening systems with sufficiently long pot life.

Accordingly, the invention relates to a process for the production of epoxy resin castings by reaction of a liquid polyfunctional epoxy compound, a carboxylic anhydride, optionally a carboxylic acid and/or a carboxylic acid ester, a boron trifluoride complex compound, water, a cyclic ether, and one or more compounds (X) which contain at least two OH groups or at least two COOH groups, or together contain at least one OH group and one COOH group, said compounds (X) being selected from the group consisting of aliphatic glycols, polyesters and polyethers with terminal OH groups, polyesters with terminal COOH groups, and hemiesters of dicarboxylic anhydrides which carry the anhydride group at a carbocyclic ring, with polyols, which process comprises the use of a zinc fluoroborate complex compound as boron trifluoride complex compound and tetrahydropyrane as cyclic ether, the ratio of the ingredients employed in the reaction being such that the mixture contains, per 100 parts by weight of epoxy compound, more than 10 parts by weight, preferably 50 parts by weight, of the sum of carboxylic anhydride, optionally carboxylic acid and/or carboxylic acid ester, zinc fluoroborate complex compound, water, tetrahydropyrane and compound (X), and, per 1 epoxide equivalent, 0.01 to 1.0 mole of water, 0.02 to 0.2 mole of tetrahydropyrane, 0.5 to 1.8 acid equivalents, and 0.5 to 2.5 g of $BF_3$ of the zinc fluoroborate complex compound, with the proviso that, when calculating the carboxylic acid equivalents, carboxylic anhydride and carboxylic acid ester are counted as carboxylic acid.

The preferred zinc fluoroborate complex compound employed in the process of the invention is one of the formula $Zn(BF_4)_2.4H_2O$, or else one that contains tetrahydropyrane and, optionally, water, with the complexed water forming part of the total amount of water of the reaction mixture and the complexed tetrahydropyrane forming part of the total amount of tetrahydropyrane of the reaction mixture.

In the practice of this invention, it is preferred to use a carboxylic anhydride which is liquid at room temperature, or a mixture of carboxylic anhydrides, which is liquid at room temperature, or else a mixture of one or more carboxylic anhydrides with one or more carboxylic acids and/or one or more carboxylic acid esters, which mixture is liquid at room temperature.

Examples of suitable liquid anhydrides are hexahydrophthalic anhydride, methyl tetrahydrophthalic anhydride and corresponding mixtures of isomers, or methyl 1,4-endomethylenetetrahydrophthalic anhydride. Mixtures of two or more anhydrides which are liquid at room temperature owing to crystallisation properties (e.g. eutectic mixture formation) are also preferred. Combinations with solid anhydrides, e.g. phthalic anhydride and tetrahydrophthalic anhydride, are thus also entirely possible. The invention also does not in principle exclude the use of anhydride mixtures which are solid at room temperature. However, in this respect it is only possible to use those mixtures of anhydrides that very readily form a solution with all the other constituents of the mixture of the invention.

Preferred compounds (X) to be used in the practice of this invention are:

1. Alkylene glycols containing at least two OH groups and 2 to 10 carbon atoms, or polyalkylene glycol ethers having a maximum molecular weight of 1000, preferably of about 500, in which case the reaction mixture contains, per 1 epoxide equivalent, 0.01 to 0.08 OH equivalent, preferably 0.02 to 0.05 OH equivalent, of this compound. Examples of such alkylene glycols are ethylene glycol propylene glycol, 1,4-butanediol and the further homologues containing up to 10 carbon atoms. The glycols can also in principle be branched. Polyalkylene glycol ethers having molecular weights up to about 500 are preferred. A molecular weight of 1000 should not be exceeded. Examples of such polyalkylene glycol ethers are polypropylene glycol ether and polyethylene glycol ether. In this connexion too, branched compounds are very suitable.

2. Polyesters containing at least two OH groups which are obtained either by reaction of an organic dicarboxylic acid, or of an esterifiable derivative thereof, with an excess of a diol or an esterifiable derivative thereof, or by reaction of the COOH group of a polylactone with a polyol (or polyol derivative), in which case the reaction mixture contains, per 1 epoxide equivalent, 0.01 to 0.08 OH equivalent, preferably 0.02 to 0.05 OH equivalent, of this compound (X). Such polyesters are e.g. those based on adipic acid and diethylene glycol or 1,4-butanediol, and which are available commercially e.g. under the registered trademark Desmophen ® (Bayer). Examples of commercially available polyesters based on polycaprolactone are Capa ® (Solvay) and Niax ® (Union Carbide). It is also often sufficient to add a monomer lactone to the reaction mixture, because a product equivalent to the above polyester is formed therefrom secondarily.

3. Polyesters containing at least two COOH groups which are obtained either by reaction of an excess of an organic dicarboxylic acid, or of an esterifiable derivative thereof, with a diol or an esterifiable derivative thereof, or by reaction of the OH group of a polylactone with an organic dicarboxylic acid (or a derivative thereof), in which case the reaction mixture contains, per 1 epoxide equivalent, 0.01 to 0.08 COOH equivalent, preferably 0.02 to 0.05 COOH equivalent, of this compound (X). These special, preferred polyesters also comprise acid polyesters containing carbocyclic or heterocyclic rings and having the formula

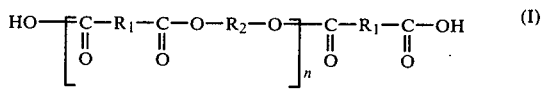

wherein $R_1$ and $R_2$ are bivalent aliphatic, araliphatic, cycloaliphatic, cycloaliphatic-aliphatic, aromatic or heterocyclic radicals, and at least one of said radicals $R_1$ and $R_2$ must contain in the recurring structural element a carbocyclic or heterocyclic ring or carbocyclic or heterocyclic ring system, and n is an integer from 2 to 10, preferably from 2 to 5, and, further, in the recurring structural element of the formula

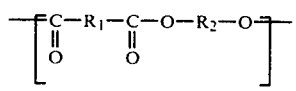

the quotient $Z_g/Z_r$ has a value of 2 to 13, preferably 4 to 10, wherein $Z_g$ is the total number of members in the straight chain of the structural element, and $Z_r$ is the number of members of the structural element consisting of a ring or ring system, with the former members being selected from the following group:

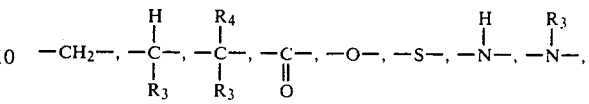

(wherein each of $R_3$ and $R_4$ is an alkyl group or an alkenyl group) or alicyclic, heterocyclic and aromatic rings or condensed or fused ring systems, with the proviso, however, that ring systems in which two rings are linked by a common spiro-carbon atom are counted as two ring members.

These special acid polyesters are described in greater detail in U.S. Pat. No. 3,624,180.

4. Polyethers containing at least two OH groups which are obtained by an advancement reaction of low molecular polyols with ethylene oxide or propylene oxide, in which case the reaction mixture contains, per 1 epoxide equivalent, 0.01 to 0.08 OH equivalent, preferably 0.02 to 0.05 OH equivalent, of this compound (X). Examples of such polyethers are commercial products which are available under the following registered trademarks: Baygal ® (Bayer), Caradol ® (Shell), Eupranol ® (BASF), Niax ® (Union Carbide), Pluracol ® (Ugine Kuhlmann) and Voranol ® (Dow Chemical). Equivalents to these polyethers are those which are obtained from the polymerisation of tetrahydrofurane, e.g. Polymeg ® (The Quaker Oats Co., USA).

5. Hemiesters of phthalic anhydride, tetrahydrophthalic anhydride or hexahydrophthalic anhydride, with an aliphatic polyol, which, as a result of further esterification, can exist in the form of oligomers having a molecular weight of up to 500. These hemiesters (especially also mixtures thereof) are present in the reaction mixture in the same concentrations as the other preferred compounds (X) previously referred to. The reason why the preferred hemiesters are so useful is, because, surprisingly, they induce a pronounced inhibition of crystallisation and thus keep the reaction mixture in a fluid state for the process of the invention.

Suitable liquid epoxy resins for the process of the invention are, in particular, resins based on bisphenol A, bisphenol F, epoxy-cresol and epoxy-phenol novolaks, and also polyesters which contain epoxy groups, aliphatic polyglycidyl ethers and cycloaliphatic epoxy resins. The invention also comprises the use of halogenated, especially brominated, epoxy compounds, e.g. dibrominated bisphenol A glycidyl ethers and dibromocresol glycidyl ethers. Such additives can impart flame resistance to the castings obtained. Mixtures of different epoxy resins are also very suitable.

The reaction mixtures for the process of the invention can also contain customary additives, such as fillers (quartz powder, powdered slate, powdered MgCa silicate, powdered barytes and alumina), dyes, mould release agents (e.g. silicones), flame retardants and the like.

The reaction of the invention can be carried out in varying sequence. In one method, all the constituents are charged into and mixed in the reactor from which the mixture is cast or removed for casting. However, it is also possible to prepare a wide variety of premixes. In such cases, however, care must be taken that these premixes do not already contain, in addition to the epoxy compounds, those substances which cause the epoxy resins to harden (crosslinking or polymerisation). When preparing the reaction mixtures for the process of the invention, it is preferred to start from two premixes or components, namely from a resin component (A) and a hardener component (b). The resin component (A) consists of the epoxy resin and, optionally, additives which do not react with the epoxy group, especially fillers, dyes and mould release agents. The hardener component (B) contains, on the other hand, the following substances: the carboxylic anhydride, optionally the carboxylic acid and/or carboxylic acid ester, the zinc fluoroborate complex compound which contains water and, optionally, tetrahydropyrane, one or more compounds (X) and, optionally, additional water and additional tetrahydropyrane. In principle, however, the hardener component (B) can also contain (wholly or partly) the substances which do not react with the epoxy group, and which are usually conveniently contained in the resin component (A), but with the proviso that these substances are also as far as possible inert to the hardeners and accelerators. Conversely, the resin component (A) can also contain (wholly or partly) e.g. the tetrahydropyrane.

The process of the invention can also be carried out stepwise, if desired. For example, it is of no consequence if small amounts of water or compounds which contain OH groups react with the carboxylic anhydride to a limited extent before the actual main reaction, to form correspondingly small amounts of carboxylic acids or carboxylic acid esters.

The process of the invention relates in particular to the simple casting method using moulds, but it also encompasses pressure gelation and injection moulding.

The reaction is preferably carried out in the temperature range from 75° to 120° C. In the simple casting method, the procedure is such that the moulds are heated to about 80° C. and the reaction mixture, which is advantageously at room temperature, is then put into them. It often suffices to remove the solidified casting as soon as possible from the mould. It then has already the desired valuable properties. It is often necessary to effect a post-curing at a temperature up to 100° C., preferably at 80° C.

The castings obtained by the process of the invention can be used for encapsulating or encasing electrical components, especially heat-sensitive electronic components.

The following Examples illustrate the invention in more detail. Unless otherwise expressly stated, parts are by weight.

EXAMPLE 1

The following resin components (A) and hardener components (B) are used in the experiment:

Resin component (A$^1$). It consists of a mixture of 34.5 parts of bisphenol A glycidyl ether (5.2 moles of epoxide/kg of resin) and 50 parts of MgCa silicate.

Hardener component (B$^1$). It consists of a mixture of the following substances:
(a) 8.6 parts of an anhydride mixture consisting of
  10 parts of phthalic anhydride
  15 parts of tetrahydrophthalic anhydride
  75 parts of hexahydrophthalic anhydride
(b) 5.2 parts of polyester polyol (type Capa 305 ®, Solvay); 5.5 moles of OH/kg and OH-equivalent weight ~180.
(c) 1.7 parts of zinc fluoroborate complex compound which is obtained as follows:

A 1 liter round flask, equipped with reflux cooler and stirrer, is charged with 378.6 parts of tetrahydropyrane and 123 parts of zinc fluoride. With stirring, 207.6 parts of boron fluoride dihydrate are added, in portions, in the course of 10 minutes, whereupon the mixture warms to 70° C. The mixture is then stirred further at 80° C. for 30 minutes under reflux, then cooled to room temperature, and filtered over a pressure filter.

The resin component (A$^1$) is mixed for 1 minute with the hardener component (B$^1$) in the ratio of 45 parts of (B$^1$) to 100 parts of epoxy resin. The mixture accordingly contains, per 1 epoxide equivalent, 0.38 mole of anhydride, 0.03 OH-polyol equivalent and 0.054 mole of water. The mixture is then deaerated in vacuo (1.333·10$^2$ Pa) for 10 minutes. The reaction mixture obtained can be readily cast at room temperature, has a pot life of ca. 50 minutes, and gels at 80° C. in the course of 40 seconds. The reaction mixture is poured into aluminium moulds measuring 3×20×25 cm (=3.2 kg) and having a temperature of 80° C. The casting is removed from the mould after 3 minutes, during which time the temperatures does not substantially exceed 80° C. Some of the castings are given a post-curing for 10 hours at 80° C. The properties of the castings are reported in Table 1.

EXAMPLE 2

The procedure of Example 1 is repeated, except that the resin component (A$^2$) contains 37 parts of bisphenol A glycidyl ether instead of 34.5 parts, and the hardener component (B$^2$) contains 9.6 parts of the anhydride mixture, 1.9 parts of the polyester polyol (Capa 305 ®), and 1.9 parts of the zinc fluoroborate complex compound. The product is a casting resin which gels at 80° C. within 30 seconds and has a pot life at room temperature (100 g) of 45 minutes. The reaction mixture is cast in accordance with the particulars of Example 1 and, as in that Example, virtually no exothermic reaction occurs. The casting, which is subsequently subjected to a post-curing for 10 hours at 80° C., has virtually the same properties as the post-cured casting obtained in Example 1. Exceptions in this respect are the shear modulus T$_G$max, the E-modulus and the electrical values, as may be seen from Table 1.

EXAMPLE 3

As resin component (A$^3$), only the epoxy resin of Example 1 is used. The hardener component (B$^3$) has the following composition:
(a) 25 parts of methyl tetrahydrophthalic anhydride
(b) 5 parts of ε-caprolactone
(c) 5 parts of zinc fluoroborate complex compound of Example 1
(d) 3.3 parts of tetrahydropyrane.

100 parts of the epoxy resin are mixed with 38.3 parts of the hardener component (B$^3$). The resultant casting resin gels at 80° C. within 50 seconds and has a pot life at room temperature (100 g) of 45 minutes.

The casting resin is poured into the mould as in Example 1 and left to stand for 6 hours without subsequent heating. During this casting, the temperature likewise does not substantially exceed 80° C. After removal from the mould, the casting is subjected to post-curing for 3 hours at 100° C. The test values are also reported in Table 1.

TABLE 1

| | Test standard | Example 1 directly after mould release | Example 1 after post-curing for 10 h at 80° C. | Example 2 after post-curing for 10 h at 80° C. | Example 3 6 h at RT* + post-curing for 3 h at 100° C. |
|---|---|---|---|---|---|
| GTT (°C.)** (DTA-Mettler 1000) | | 58 | 86 | virtually as in Example 1 | 94 |
| shear modulus; $T_G$ max. °C. | DIN 53 445 | 90 | 102 | 112 | 114 |
| Shore hardness D | | 92 | 93 | virtually as in Example 1 | 87 |
| impact strength KJ/m² | DIN 53 453 | 10 | 10 | virtually as in Example 1 | 19 |
| E-modulus N/mm² | DIN 53 457 | 6 130 | 6 520 | 6 770 | 2 910 |
| flexural strength n/mm² | DIN 53 452 | 78 | 83 | virtually as in Example 1 | 135 |
| absorption of boiling water (4 h 98° C.) % | | 1.2 | 0.9 | virtually as in Example 1 | 1.57 |
| dissipation factor tgδ . 10² RT* | DIN 53 483 | 0.49 | 0.28 | virtually as in Example 1 | 0.44 |
| 80° F. | | 30.96 | 3.6 | virtually as in Example 1 | 4.56 |
| dissipation factor tgδ . 10² after 4 h in boiling water RT* | | 4.25 | 2.2 | virtually as in Example 1 | 1.43 |
| 80° C. | | 38.12 | 9.23 | virtually as in Example 1 | 24.27 |
| relative permittivity $E_r$ RT* | DIN 53 483 | 5.2 | 4.8 | virtually as in Example 1 | 3.8 |
| 80° C. | | 8.2 | 5.5 | virtually as in Example 1 | 4.7 |
| after 4 h in boiling water RT* | | 10.6 | 6.6 | virtually as in Example 1 | 4.7 |
| 80° C. | | 22.6 | 6.6 | virtually as in Example 1 | 7.1 |

TABLE 1-continued

| | Test standard | Example 1 directly after mould release | Example 1 after post-curing for 10 h at 80° C. | Example 2 after post-curing for 10 h at 80° C. | Example 3 6 h at RT* + post-curing for 3 h at 100° C. |
|---|---|---|---|---|---|
| volume resistivity RT* | DIN 53 482 | $1.6 \cdot 10^{15}$ | $1.1 \cdot 10^{16}$ | virtually as in Example 1 | $6.1 \cdot 10^{15}$ |
| Ω . cm 80° C. | | $4.8 \cdot 10^{10}$ | $1.9 \cdot 10^{12}$ | virtually as in Example 1 | $5.3 \cdot 10^{11}$ |
| after 4 h in boiling water RT* | | $1.4 \cdot 10^{11}$ | $2.6 \cdot 10^{11}$ | $\sim 2.5 \cdot 10^{12}$ | $3.8 \cdot 10^{14}$ |
| 80° C. | | $3.9 \cdot 10^{13}$ | $4.2 \cdot 10^{13}$ | $\sim 4.0 \cdot 10^{14}$ | $7.7 \cdot 10^{12}$ |

*RT = room temperature
**glass transition temperature

EXAMPLES 4 AND 5

The procedures employed in Examples 4 and 5 are illustrated in Table 2. The dibrominated bisphenol A glycidyl ether, the dibromocresol glycidyl ether and the bisphenol A glycidyl ether of Example 1, are the possible components of the respective resin components (A). All other substances are constituents of the respective hardener component (B).

From the text values reported in the table, it can be seen that there is very little exothermic reaction when using the process of the invention. The peak temperature is measured by filling a cardboard beaker with 100 g of the mixture at room temperature and putting it into a forced draught oven with an operating temperature of 80° C. The temperature of the mixture is measured until the peak is exceeded.

TABLE II

| Components | | Example 4 | Example 5 |
|---|---|---|---|
| dibrominated bisphenol A glycidyl ether | | 24.0 | — |
| dibromocresol glycidyl ether | | 25.0 | — |
| bisphenol A glycidyl ether of Example 1 | | 51.0 | 100.0 |
| methyl tetrahydrophthalic anhydride | | 62.8 | 26.7 |
| hemiester of { 2 moles of tetrahydrophthalic anhydride, 1 mole of neopentyl glycol } | | 6.0 | 6.7 |
| zinc fluoroborate-tetrahydropyrane complex of Example 1 | | 1.2 | 1.6 |
| polyesterpolyol (Capa 305 ®) | | — | 6.7 |
| pot life**, from room temperature | min | 32 | 8 |
| gel time on B-time metal sheet at 80° C. | min | 2 | 1 |
| peak temperature** at starting temp. of 80° C. | °C. after min | 160 15 | 180 12 |

*parts by weight/** of 100 g mixture

What is claimed is:

1. A process for the production of epoxy resin castings by reaction of a liquid polyfunctional epoxy compound, a carboxylic anhydride, optionally a carboxylic acid and/or a carboxylic acid ester, a boron trifluoride complex compound, water, a cyclic ether, and one or more compounds (X) which contain at least two OH groups or at least two COOH groups, or together contain at least one OH group and one COOH group, said compounds (X) being selected from the group consisting of aliphatic glycols, polyesters and polyethers with terminal OH groups, polyesters with terminal COOH groups, and hemiesters of dicarboxylic anhydrides which carry the anhydride group at a carbocyclic ring, with polyols, which process comprises the use of a zinc fluoroborate complex compound as boron trifluoride complex compound and tetrahydropyrane as cyclic ether, the ratio of the ingredients employed in the reaction being such that the mixture contains, per 100 parts by weight of epoxy compound, more than 10 parts by weight, preferably 50 parts by weight, of the sum of carboxylic anhydride, optionally carboxylic acid and/or carboxylic acid ester, zinc fluoroborate complex compound, water, tetrahydropyrane and compound (X), and, per 1 epoxide equivalent, 0.01 to 1.0 mole of water, 0.02 to 0.2 mole of tetrahydropyrane, 0.5 to 1.8 acid equivalents, and 0.5 to 2.5 g of $BF_3$ of the zinc fluoroborate complex compound, with the proviso that, when calculating the carboxylic acid equivalents, carboxylic anhydride and carboxylic acid ester are counted as carboxylic acid.

2. A process according to claim 1, which comprises the use of a zinc fluoroborate complex compound of the formula $Zn(BF_4)_2.4H_2O$, in which compound the complexed water is part of the total amount of water of the reaction mixture.

3. A process according to claim 1, which comprises the use of a zinc fluoroborate complex compound which contains tetrahydropyrane and, optionally, water, in which compound the complexed water is part of the total amount of water of the reaction mixture, and the complexed tetrahydropyrane is part of the total amount of tetrahydropyrane of the reaction mixture.

4. A process according to claim 1, which comprises the use of a carboxylic anhydride which is liquid at room temperature, or a mixture of carboxylic anhydrides, which mixture is liquid at room temperature.

5. A process according to claim 1, which comprises the use of a mixture of one or more carboxylic anhydrides with one or more carboxylic acids and/or one or more carboxylic acid esters, which mixture is liquid at room temperature.

6. A process according to claim 1, wherein the compound (X) is an alkylene glycol containing at least two OH groups and 2 to 10 carbon atoms, or a polyalkylene glycol ether having a maximum molecular weight of 1000, the reaction mixture containing, per 1 epoxide equivalent, 0.01 to 0.08 OH equivalent of said compound (X).

7. A process according to claim 1, wherein the compound (X) is a polyester which contains at least two OH groups and which has been obtained either by reaction of an organic dicarboxylic acid, or of an esterifiable derivative thereof, with an excess of a diol or an esterifiable derivative thereof, or by reaction of the COOH group of a polylactone with a polyol (or polyol derivative), the reaction mixture containing, per 1 epoxide equivalent, 0.01 to 0.08 OH equivalent of said compound (X).

8. A process according to claim 1, wherein the compound (X) is a polyester which contains at least two COOH groups, and which is obtained by reaction of an excess of an organic dicarboxylic acid, or of an esterifiable derivative thereof, with a diol or an esterifiable derivative thereof, or by reaction of the OH group of a polylactone with an organic dicarboxylic acid (or a derivative thereof), the reaction mixture containing, per 1 epoxide equivalent, 0.01 to 0.08 COOH equivalent of said compound (X).

9. A process according to claim 1, wherein the compound (X) is a polyether which contains at least two OH groups, and which is obtained by advancement reaction of a low molecular polyol with ethylene oxide or propylene oxide, the reaction mixture containing, per 1 epoxide equivalent, 0.01 to 0.08 OH equivalent of said compound (X).

10. A process according to claim 1, wherein the compound (X) is a hemiester of phthalic anhydride, tetrahydrophthalic anhydride or hexahydrophthalic anhydride with an aliphatic polyol which, as a result of further esterification, can also exist in the form of an oligomer with a molecular weight of up to 500.

11. A process according to claim 1, wherein the reaction is carried out in the temperature range from 75° to 120° C., and the castings obtained are optionally postcured at a temperature up to 100° C.

12. A process according to claim 1, wherein the process is carried out stepwise.

13. A process according to claim 1 for the production of castings for encapsulating or encasing electrical components, in particular heat-sensitive electronic components.

* * * * *